(12) United States Patent
Su et al.

(10) Patent No.: US 7,501,862 B2
(45) Date of Patent: Mar. 10, 2009

(54) COMPARATOR WITH LOW OFFSET VOLTAGE

(75) Inventors: Tsung-Yi Su, Tainan (TW); Kuo-Chan Huang, Tainan (TW)

(73) Assignee: Himax Technologies Limited (TW)

( * ) Notice: Subject to any disclaimer, the term of this patent is extended or adjusted under 35 U.S.C. 154(b) by 89 days.

(21) Appl. No.: 11/767,283

(22) Filed: Jun. 22, 2007

(65) Prior Publication Data

US 2008/0315924 A1  Dec. 25, 2008

(51) Int. Cl.
*H03K 5/22* (2006.01)

(52) U.S. Cl. .............................. 327/63; 327/64; 327/65; 327/55; 327/56; 327/57

(58) Field of Classification Search ........................ None
See application file for complete search history.

(56) References Cited

U.S. PATENT DOCUMENTS

| | | | | |
|---|---|---|---|---|
| 4,845,675 | A * | 7/1989 | Krenik et al. | ................ 365/203 |
| 5,668,486 | A | 9/1997 | Brehmer | |
| 6,008,673 | A * | 12/1999 | Glass et al. | .................... 327/77 |
| 6,144,231 | A | 11/2000 | Goldblatt | |
| 6,424,181 | B1 * | 7/2002 | Pogrebnoy | .................... 327/55 |
| 6,449,191 | B1 * | 9/2002 | Lin et al. | ................ 365/185.21 |

OTHER PUBLICATIONS

T.B. Cho and P.R. Gray; "A 10b, 20 Msample/s, 35 mW Pipeline A/D Converter", IEEE JSSC, vol. 30, No. 3, Mar. 1995.

* cited by examiner

*Primary Examiner*—Tuan T Lam
*Assistant Examiner*—Hiep Nguyen
(74) *Attorney, Agent, or Firm*—Baker & McKenzie LLP

(57) ABSTRACT

A differential comparator is provided. The comparator receiving two differential signals and generating a comparison result represented by an output signal on one of two output terminals respectively on two current paths. The comparator comprises two pairs of latch transistors respectively disposed on the two current paths and two pairs of input transistors respectively disposed on the two current paths, wherein gates of the latch transistors on one of the current paths are commonly coupled to the output terminal between the latch transistors on the other current path, gates of the input transistors on one of the current paths respectively receives an input signal of one of the differential signals and a reference signal of the other differential signal and each of the input transistors is disposed between the output terminal and one of the latch transistors on the current path thereof.

7 Claims, 5 Drawing Sheets

COMPARATOR WITH LOW OFFSET VOLTAGE

FIELD OF THE INVENTION

The invention relates to analog integrated circuits, and in particular, to a comparator with low voltage offset.

BACKGROUND OF THE INVENTION

FIG. 1 illustrates a comparator that comprises several capacitors. Two pairs of voltages are provided. The first pair is VIP 115 and VIN 19 which represent the positive and negative inputs. The second pair is VRP 116 and VRN 18 which represent the positive and the negative reference inputs. Two capacitors 120 and 16 are used to receive input signals. An NMOS transistor 118, controlled by the phase I signal 117, is electrically connected to the VRP 116 and terminal 119 of the capacitor 120. An NMOS transistor 111, controlled by the phase I signal 17, is electrically connected to the VRN 18 and terminal 110 of the capacitor 16. A phase II signal 113 that controls an NMOS transistor 114 and an NMOS transistor 112 is also provided. The NMOS transistor 114 is electrically connected to the VIP 115 and terminal 119. The NMOS transistor 112 is electrically connected to the VIN 19 and terminal 110. NMOS transistor 122, controlled by phase I signal 123, provides common mode voltage 121 to output terminal 124 of capacitor 120. Moreover, NMOS 125 transistor, controlled by phase I signal 13 provides common mode voltages 14 to output terminal 15 of capacitor 16. The output terminals 124 and 15 are electrically connected to a latch 11 which provides an output 12. The output 12 shows the comparison result between input signals. Typically, a latch with positive feedback is used to lock the difference between the voltage on terminals 124 and 15. There are provided two steps to control the phase I signals 123, 13, 117, and 17, and phase II signal 113. In phase I, the terminals 124 and 15 receive the common voltage reference. Terminals 119 and 110 receive the input reference voltages VRP 116 and VRN 18, respectively. In phase II, the switches 114 and 112 are enabled, i.e. the transistors are turned on. The input voltages VIP 115 and VIN 19 are sent to the terminals 119 and 110, respectively. Thus, if the voltage difference between VIP 115 and VIN 19 is greater than the voltage difference between VRP 116 and VRN 18, then the output 12 may be in high state. For example, if VIP 115, VIN 19, VRP 116, VRN 18 are 3V, 2V, 5V and 4.5V respectively, then terminal 15 has a voltage of −2.5V and terminal 124 has a voltage of −2V. The voltage of terminal 124 is 0.5V higher than that of terminal 15, which is to the same as the result of the equation [(VIP−VIN)−(VRP−VRN)].

The example in FIG. 1 uses many capacitors. This means the embodiment involves more complex processing steps, i.e. expensive mixed-mode process.

FIG. 2 shows a comparator introduced in the paper by T. B. Cho and P. R. Gray, entitled "A 10b, 20 Msample/s, 35 mW Pipeline A/D Converter," IEEE JSSC, Vol. 30, No. 3, March 1995. The disclosure of which is herein incorporated by reference. The comparator is composed of MOS transistors. This comparator utilizes a dynamic cross-coupled inverter latch to eliminate the static power dissipation. The dynamic comparator uses a positive feedback latch. The positive feedback latch comprises (1) PMOS transistors 218 and 221 which are electrically connected to the NMOS transistors 215 and 25 via the wires GP 219 and GN 220; (2) a pair of NMOS transistors 212 and 29 which are electrically connected to receive the input reference voltages VRN 211 and VRP 210; and (3) a pair of NMOS transistors 27 and 213 which are connected to receive the input reference voltages VIN 26 and VIP 214. Furthermore, a PEV signal 23 is electrically connected to both the gates of PMOS transistors 22 and 217, and also NMOS transistors 24 and 216, to reset the latch before the comparator begins to evaluate.

A transistor string which comprises the PMOS transistor 22, NMOS transistor 24, NMOS transistor 25 and NMOS transistor 27 is orderly arranged in serial. The power connection 21 is connected to the PMOS transistor 22. The ground 28 is connected to the source of the NMOS transistor 27. Another string which comprises the PMOS transistor 221, NMOS transistor 24, NMOS transistor 25 and NMOS transistor 210 is orderly arranged in serial. The power connection 21 is electrically connected to the PMOS transistor 221. The ground 28 is electrically connected to the source of the NMOS transistor 210.

A transistor string which comprises the PMOS transistor 217, NMOS transistor 216, NMOS transistor 215 and NMOS transistor 213 is sequentially arranged. The power connection 21 is connected to the PMOS transistor 217. The ground 28 is connected to the source of the NMOS transistor 213. Another string which comprises the PMOS transistor 218, NMOS transistor 216, NMOS transistor 215 and NMOS transistor 212 is sequentially arranged. The power connection 21 is connected to the PMOS transistor 218. The ground 28 is connected to the source of the NMOS transistor 212. When the PEV signal 23 is in low state, the PMOS transistors 22 and 217 are turned on. The power connection 21 provides current to the GP 219 and GN 220. The NMOS transistors 216 and 24 are turned off during the low state. No current is leaked to the ground 28 in the path of NMOS transistors 25, 27 and 29 or the path of NMOS transistors 215, 212 and 213. As mentioned in the reference by Cho et al., the NMOS transistors 213, 212, 29, 27 are all biased in triode region. The conductance G1 and G2 thereof are given by $$G1 = kp\left[\frac{W1}{L}(VIP - Vth) + \frac{W2}{L}(VRN - Vth)\right]$$

wherein Vth is the threshold voltage of the NMOS transistor, kp is a constant related to the physical characteristics of the transistor and W1, W2 and L are the dimensions of the transistor.

$$G2 = kp\left[\frac{W1}{L}(VIN - Vth) + \frac{W2}{L}(VRP - Vth)\right]$$

wherein Vth is the threshold voltage of the NMOS transistor, kp is a constant related to the physical characteristics of the transistor and W1, W2 and L are the dimensions of the transistor.

The comparator changes its state when the differential inputs exceed the comparator threshold voltage. The comparator threshold voltage is provided by $$Vin(\text{threshold}) = \frac{W2}{W1} \cdot Vref$$

wherein Vin=VIP−VIN and Vref=VRP−VRN.

The comparator in FIG. 2 saves power by using a dynamic approach. It is well known to those skilled in the art that the process variations and mismatches can result in greater offset voltage in typical dynamic cross-coupled inverter latches.

In U.S. Pat. No. 5,668,486 to Brehmer, entitled "Strobed comparator for a large common mode range," a comparator having a large common mode range is described. The disclosure of which is herein incorporated by reference. It utilizes a high-swing folded-cascade architecture to achieve an improved dynamic range. By using a folded cascade design, a wide dynamic range of operations can be obtained. However, this design requires the normal and enhancement transistors which can complicate the manufacturing process and increase the cost. Moreover, this design also suffers the offset and mismatch problems.

In U.S. Pat. No. 6,144,231 to Goldblatt, entitled "High Speed Dynamic Latch Comparator," a comparator circuit design is disclosed. The entire disclosure of which is herein incorporated by reference. An additional differential amplifier circuitry with pull-down devices is electrically connected to the GN 220 and GP 219 in FIG. 2. The pull-down devices accelerate the positive feedback mechanism and increase the comparing operation. As mentioned in this disclosure, the voltage error is primarily caused by current differences. The current differences relate to the gate threshold voltage (Vt) and the susceptance (B). The voltage error can be derived from the following equation:

$$err = V2\left[1 - \frac{B1 \cdot (Vgs - Vt1)^2}{B2 \cdot (Vgs - Vt2)^2}\right]$$

wherein V2 is the input voltage; B1 and B2 are the susceptance of the primary pull-down devices; and Vt1 and Vt2 are the threshold voltages.

Enlarging the dimensional size of the pull-down devices can minimize the voltage error. However, this design requires extra elements to overcome the variation in the primary pull-down devices.

SUMMARY OF THE INVENTION

The present invention improves the offset voltage created by the process variations on the semiconductor devices, and in particular, the offset voltage of a comparator circuit.

The present invention provides a differential comparator receiving two differential signals and generating a comparison result represented by an output signal on one of two output terminals respectively on two current paths. The comparator comprises two pairs of latch transistors respectively disposed on the two current paths, and two pairs of input transistors respectively disposed on the two current paths, wherein gates of the latch transistors on one of the current paths are commonly coupled to the output terminal between the latch transistors on the other current path, gates of the input transistors on one of the current paths respectively receives an input signal of one of the differential signals and a reference signal of the other differential signal, and each of the input transistors is disposed between the output terminal and one of the latch transistors on the current path thereof.

DESCRIPTION OF EMBODIMENTS OF THE INVENTION

Figure 3:
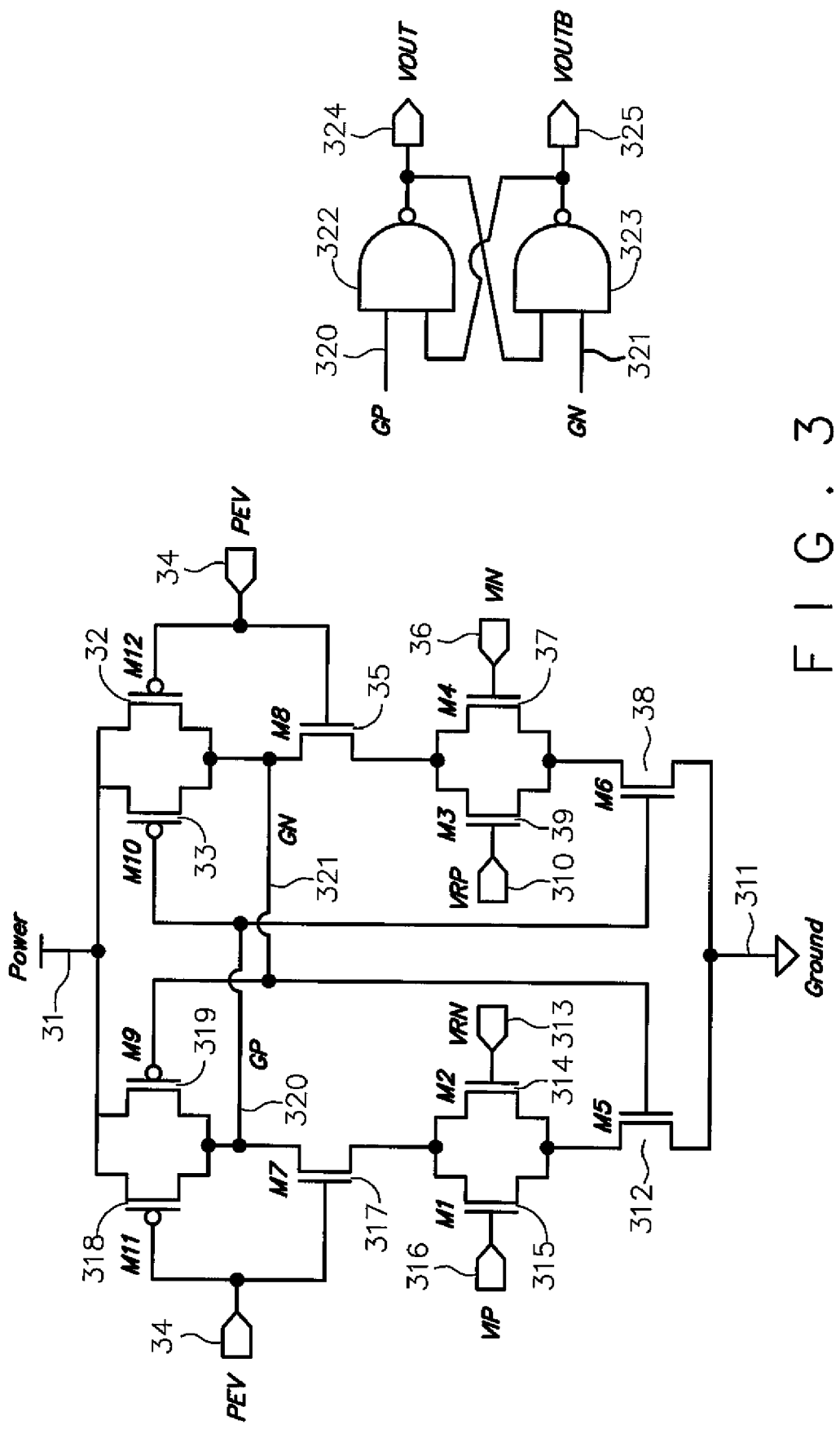
FIG. 3 illustrates a comparator having low offset voltage according to one embodiment of the invention.

FIG. 3 illustrates a comparator with low offset voltage according to one embodiment of the invention. The comparator receives a first differential signal from an input signal VIP and a reference signal VRP, and receives a second differential signal from an input signal VIN and a reference signal VRN. The comparison result of the two differential signals may be represented by the signal on output terminals GP or GN, or by the signal VOUT or VOUTB.

The comparator includes (1) a positive feedback latch including two pairs of latch transistors, wherein one of the pairs includes PMOS transistor 319 and NMOS transistor 312, and the other pair includes PMOS transistor 33 and NMOS transistor 38, (2) a first pair of input transistors 315, 313, and (3) a second pair of input transistors 37, 39. The gates of the latch transistors 319 and 312 are coupled to the output terminal GN and the gates of the latch transistors 33 and 38 are coupled to the output terminal GP. The drain terminal of the latch transistor 312 is connected to the source terminals of the input transistors 315 and 314 while the drain terminal of the latch transistor 38 is connected to the source terminals of the input transistors 39 and 37. The source terminals of the latch transistors 312 and 38 are commonly connected to the ground. The gates of the input transistors 315 and 313 respectively receives the input signal VIP of the first differential signal and a reference signal VRN of the second differential signal while the gates of the input transistors 37 and 39 respectively receives the input signal VIN of the second differential signal and the reference signal VRP of the first differential signal. Those skilled in the art should know that the source and the drain of each MOS transistor may be exchanged.

According to FIG. 3, the comparator further includes a reset mechanism composed of four switches respectively implemented by PMOS transistors 318 and 32, and NMOS transistors 317 and 35. The PMOS transistors 318 and 32 are connected to the latch transistors 319 and 33 in parallel. The drain terminals of the NMOS transistors 317 and 35 are connected to the drain terminals of the latch transistors 319 and 33. The source terminal of NMOS transistor 317 is further connected to the drain terminals of the input transistors 315 and 314 while the source terminal of NMOS transistor 35 is connected to the drain terminals of the input transistors 39 and 37. A timing control signal PEV is applied to the gates of the NMOS transistors 317 and 35 and the gates of the PMOS transistors 318 and 32.

There is an additional digital latch that comprises two NAND gates 322 and 323. Each input, i.e. input 320 or 321, is connected to one of the output terminals GP and GN. Another input, i.e. input 324 or 325, is cross coupled to other output, i.e. VOUTB 325 or VOUT 324. The digital latch is coupled to the main comparator. This allows the analog output of the comparator to convert into digital outputs VOUT 324 and VOUTB 325 for digital signal processing.

On the left side, the power connection 31, the PMOS transistor 33, the NMOS transistor 35, the NMOS transistor 39, the NMOS transistor 38 and the ground connection 311 are connected in serial to form a current path. The power connection 31 sends a current first through the PMOS transistor. The current then flows through the NMOS transistors and to the ground connection 311. On the right side, the power connection 31, the PMOS transistor 32, the NMOS transistor 35, the NMOS transistor 36, the NMOS transistor 38 and the ground 311 are also connected in serial to form another current path. The power connection 31 provides a current flow through the PMOS transistor 32 and sets the GN 321 in pre-charge status.

Similarly, the power connection 31, the PMOS transistor 319, the NMOS transistor 317, the NMOS transistor 314, the NMOS transistor 312 and the ground 311 are connected in serial to form a current path. The power connection 31 sends a current through the PMOS. The current then flows through NMOS transistors and to the ground 311. The power connection 31, the PMOS transistor 318, the NMOS transistor 317, the NMOS transistor 316, the NMOS transistor 312 and the ground 311 are also connected serially to form another current path. The power connection 31 sends a current through the PMOS transistor 318 and sets the GP 320 in pre-charge status.

NMOS transistor 312 is inserted between NMOS transistors 315, 314 and ground 311. NMOS transistor 38 is inserted between NMOS 39, 37 and ground 311. Both NMOS transistors 312 and 38 not only perform the positive feedback function but are also used as resistive elements. The output resistance of this cascade circuit is increased according to the following equation.

$$Rout = (Gm2Rds2)Rds1$$

Wherein Rout is the output resistance of the transistor; Gm is the conductance of the transistor; Rds is the resistance from the drain terminal to the source terminal; and the index number 2 refers to the NMOS transistor 315 and index number 1 refers to the NMOS transistor 312.

Therefore, the effective transconductance of the NMOS transistor 315 is given by $$Gm(\text{effective}) = \frac{Gm}{1 + GmRds1}$$

wherein the index number 1 refers to the NMOS transistor 312 and the Gm is the transconductance of the NMOS transistor 315.

According to the equation, the NMOS transistor 315 obtains a more linear property in order to compensate the process variations. The NMOS transistors 315 and 312 also form a negative feedback. When the current flowing through the NMOS transistor 315 is too large, the rising voltage on the source terminal of the NMOS transistor 315 creates a resistance to the current, whereby a better linearity is obtained compared to the circuit configurations of the prior arts.

Figure 4:
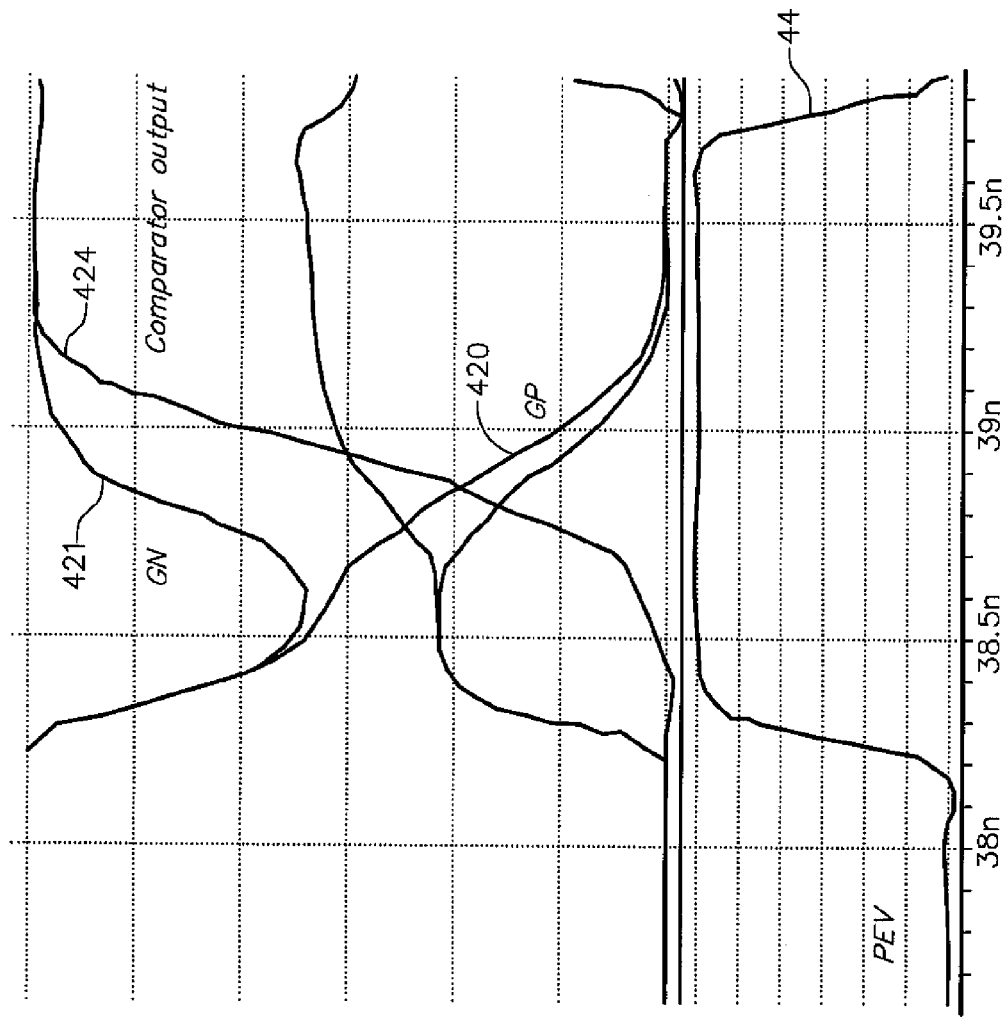
FIG. 4 is the simulation result of the comparator shown in FIG. 3.

FIG. 4 is a simulation result of the output signals on the output terminals GN and GP. According to one embodiment of the present invention, when the timing control signal PEV enters low state during a reset phase, the output signals on the terminals GN and GP are charged to a high voltage. When the timing control signal PEV enters the high state during an evaluation phase, the PMOS transistors 32 and 318 mentioned in FIG. 3 are turned off and the NMOS transistors 35 and 317 are turned on. Meanwhile, the NMOS transistors 312 and 38 are turned on due to the high voltage of the output signals on the output terminals GN and GP.

Once the charging and conduction of the NMOS transistors 312 and 38 cease, the output signals GN 421 and GP 420 begin an evaluation step, i.e. the unbalance status. The NMOS transistors 312 and 38 discharge the output signals on the output terminals GN and GP until the voltage thereof falls to an intermediate voltage level. Afterward, the output signals start to depart from each other due to the voltage difference between the differential inputs and reference inputs. The positive feedback latch will accelerate the departure of the output signals. The comparator may perform the comparison operation within few nanoseconds depending on the process technology used. Finally, the output signals are transmitted to the digital latch circuit.

The comparator with a positive feedback latch can have a hysteresis property. When the comparator is initialized by the timing control signal PEV, the PMOS transistors 32 and 318 are turned on while the NMOS transistors 35 and 317 are turned off. During this reset phase, the signals on the output terminals GP and GN are charged to high state. After the reset phase, the timing control signal turns off the PMOS transistors 32 and 318 and turns on the NMOS transistors 35 and 317. The power connection 31 ceases charging the signals on the output terminals GP and GN via PMOS transistors 32 and 318.

Assuming that the gate of NMOS transistor 37 is grounded and the gate of the NMOS transistor 315 is higher than zero, when the voltage of VIP 316 is increased from zero to a higher voltage, the current through the NMOS transistor 315 becomes larger due to the NMOS 312 in the positive feedback latch. There exists a positive upper trip point which can be calculated by the following equation:

$$Vtrp^+ = Vgs2 - Vgs1 = \sqrt{\frac{2i2}{\beta 2}} + Vt2 - \sqrt{\frac{2i1}{\beta 1}} + Vt1$$

wherein Vtrp+ is the threshold voltage for the upper trip point; Vgs is the voltage difference between the gate terminal and the source terminal; i is the current flow through the channel of the transistors; Vt is the threshold voltage of the transistors; β is a constant related to the physical characteristics of the transistors; and the index numbers 1 and 2 are referred to the NMOS transistor 315 and 36, respectively.

On the contrary, there is a negative lower trip point when the input voltage VIP 316 decreases from positive to zero. The positive upper trip point and the negative lower trip point decide when the comparator changes its state. The positive feedback prevents natural or coupling noise. The equations described herein are used to illustrate the present invention. They are not used for the purpose of obtaining the exact figures or limiting the scope of the invention.

Figure 1:
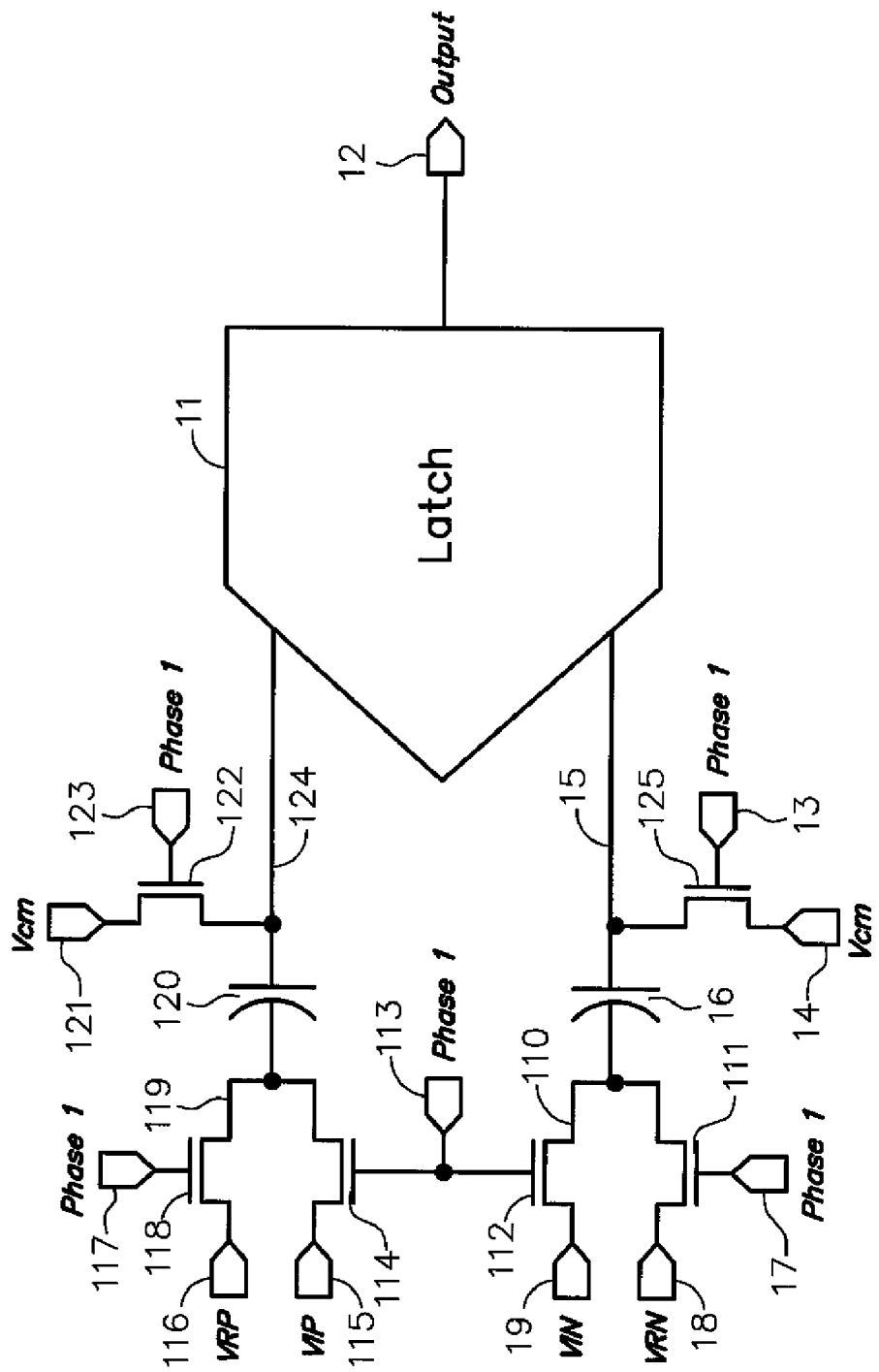
FIG. 1 shows a conventional comparator with capacitors.
Figure 2:
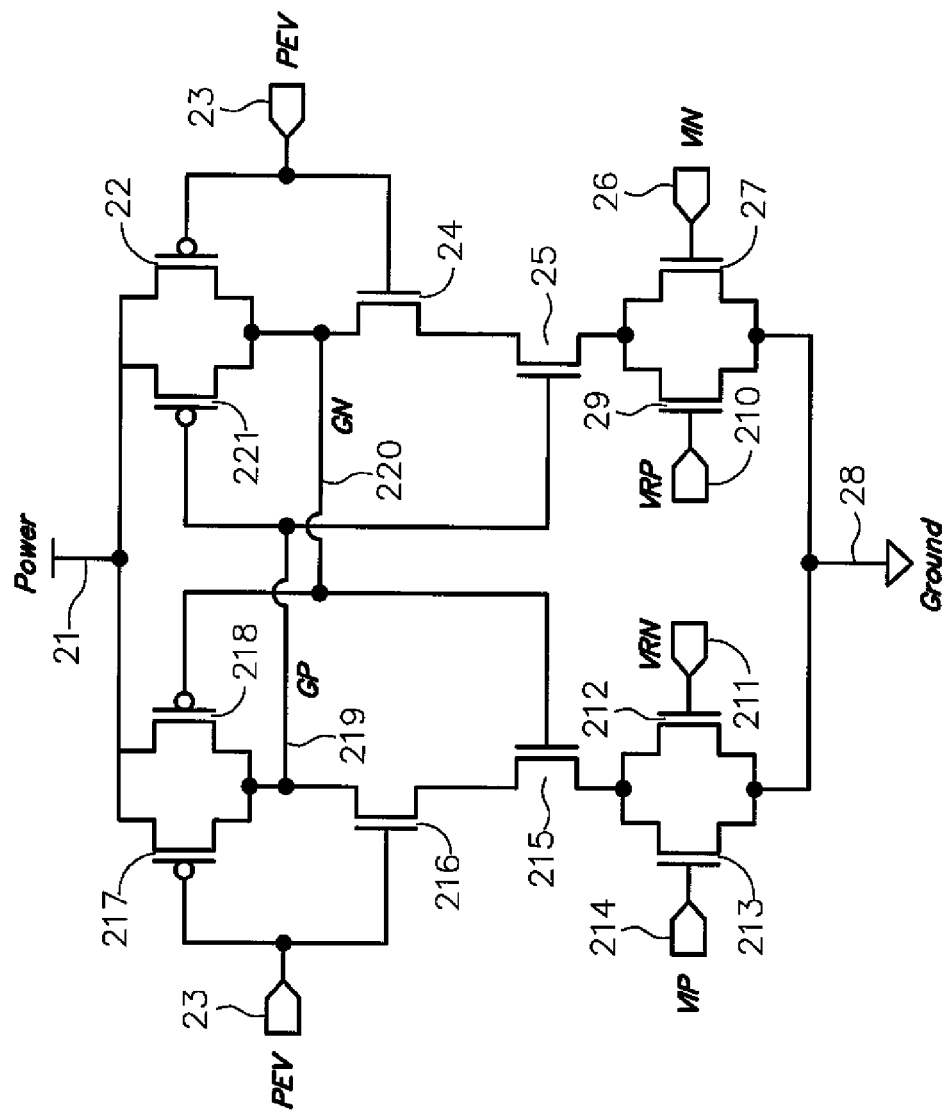
FIG. 2 illustrates a conventional comparator with a positive feedback latch.
Figure 5:
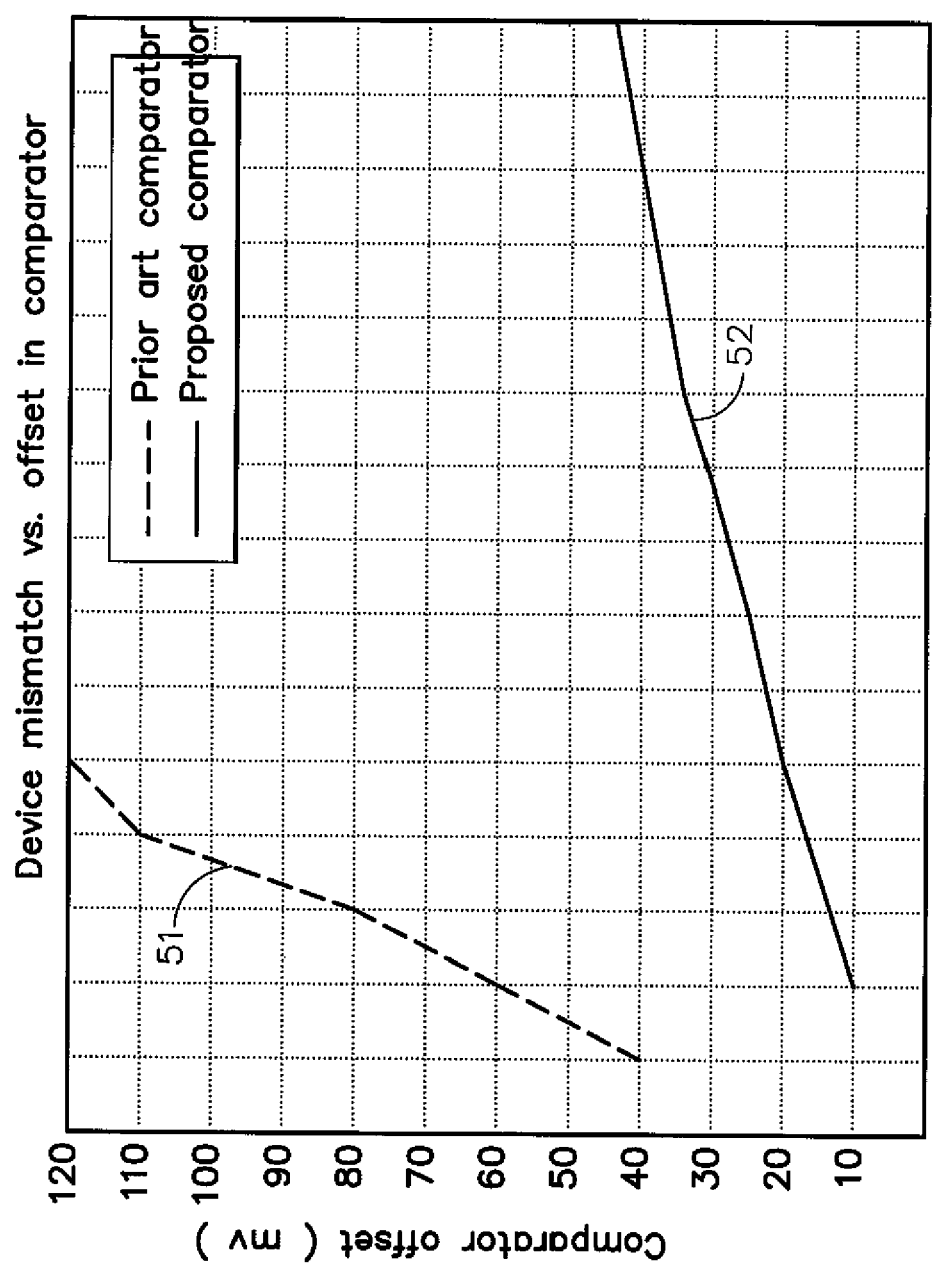
FIG. 5 shows a diagram that compares the functions of the comparators in FIG. 2 and FIG. 3

FIG. 5 illustrates the improvement of the comparator according to the present invention. The offset voltage is observed when the device mismatch is increased by the percentage. The curve 51 shows the offset voltage of the comparator used in the prior art in FIG. 2, and curve 52 shows the offset voltage of the comparator according to the present invention. When the mismatch percentage is increased from two percent to five percent, the proposed comparator only has about one sixth of the original offset voltage found in prior art. The offset voltage of the proposed comparator is approximately 20 mV when the device mismatch is five percent. Whereas the offset voltage in the prior art is around 120 mV when the mismatch is five percent.

Certain changes may be made in the description herein without departing from the spirit and scope of the invention. For example, the extra latch mentioned in FIG. 3 can be implemented by two transistors and two current sources. Therefore, the subject matter in the specification shall not be interpreted in a limiting sense.

What is claimed is:

1. A differential comparator receiving two differential signals and generating a comparison result represented by an output signal on one of two output terminals respectively on two current paths, the comparator comprising:
    two pairs of latch transistors respectively disposed on the two current paths, wherein gates of the latch transistors on one of the current paths are commonly coupled to the output terminal between the latch transistors on the other current path; and
    two pairs of input transistors respectively disposed on the two current paths, wherein gates of the input transistors on one of the current paths respectively receives an input signal of one of the differential signals and a reference signal of the other differential signal;
    wherein each of the input transistors is disposed between the output terminal and one of the latch transistors on the current path thereof.

2. The differential comparator as claimed in claim 1, wherein one of the latch transistors in each pair is NMOS transistor and the other one is PMOS transistor.

3. The differential comparator as claimed in claim 2, wherein the input transistors are NMOS transistors.

4. The differential comparator as claimed in claim 1, further comprising two first switches each of which is disposed between the output terminal and the input transistors on one of the current paths.

5. The differential comparator as claimed in claim 4, further comprising two second switches each of which is coupled between a drain and source of one of the latch transistors on one of the current paths.

6. The differential comparator as claimed in claim 5, wherein the first and second switches are respectively turned on and off during an evaluation phase of the comparator, and the first and second switches are respectively turned off and on during a reset phase of the comparator.

7. The differential comparator as claimed in claim 1, further comprising a latch circuit having two NAND gates each of which has a first input coupled to one of the output terminals and a second input coupled to an output of the other NAND gate.

* * * * *